(12) United States Patent
Hutton et al.

(10) Patent No.: US 7,839,165 B2
(45) Date of Patent: *Nov. 23, 2010

(54) USER-ACCESSIBLE FREEZE-LOGIC FOR DYNAMIC POWER REDUCTION AND ASSOCIATED METHODS

(75) Inventors: Michael D. Hutton, Mountain View, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/577,061

(22) Filed: Oct. 9, 2009

(65) Prior Publication Data

US 2010/0026340 A1 Feb. 4, 2010

Related U.S. Application Data

(63) Continuation of application No. 12/040,100, filed on Feb. 29, 2008, now Pat. No. 7,605,603.

(51) Int. Cl.
*H03K 19/173* (2006.01)
(52) U.S. Cl. .......................................... 326/38; 326/41
(58) Field of Classification Search ............... 326/37–41
See application file for complete search history.

(56) References Cited

U.S. PATENT DOCUMENTS 7,236,010 B1 * 6/2007 Keith .......................... 326/41

* cited by examiner

*Primary Examiner*—Don P Le
(74) *Attorney, Agent, or Firm*—Law Offices of Maximilian R. Peterson (57) ABSTRACT

A programmable logic device (PLD) includes a configuration circuit, and first and second freeze-logic circuits. The configuration circuit provides configuration data for configuring programmable resources of the PLD during a configuration mode of the PLD. One of the two freeze-logic circuits provides a freeze logic signal during the configuration mode of the PLD. The other freeze-logic circuit provides a freeze logic signal during a user mode of the PLD.

6 Claims, 10 Drawing Sheets

Fig. 10

USER-ACCESSIBLE FREEZE-LOGIC FOR DYNAMIC POWER REDUCTION AND ASSOCIATED METHODS

CROSS REFERENCE TO RELATED APPLICATIONS

This patent application is a continuation of, and incorporates by reference, U.S. patent application Ser. No. 12/040,100, filed on Feb. 29, 2008, titled "User-Accessible Freeze-Logic for Dynamic Power Reduction and Associated Methods,", now U.S. Pat. No. 7,605,603.

TECHNICAL FIELD

The disclosed concepts relate generally to adjusting the performance of programmable logic devices (PLDs) and, more particularly, to adjusting power consumption of PLDs.

BACKGROUND

PLDs are flexible electronic devices that allow users to change or program the functionality of the device as desired. To accommodate the users' increasingly complex designs, modern PLDs include a relatively large number of transistors. As a result, power consumption, power dissipation, die temperatures and, hence, power density (power dissipation in various circuits or blocks), of PLDs has become an increasingly important issue.

SUMMARY

One aspect of the disclosed concepts relates to user-accessible and user-controllable freeze-logic in PLDs. In one exemplary embodiment, a PLD includes a configuration circuit and a freeze-logic circuit. The configuration circuit provides configuration data for configuring programmable resources of the PLD during a configuration mode of the PLD. In another exemplary embodiment, a PLD includes a logic array block. The logic array block has a logic element that provides a signal that a user of the PLD may freeze during a user mode of the PLD.

Another aspect of the disclosed concepts relates to methods of using user-accessible and user-programmable freeze-logic signals in PLDs or operating PLDs with such signals. In one illustrative embodiment, a method of operating a PLD includes using one freeze-logic signal during a configuration mode of the PLD, and using another freeze-logic signal during a user mode of the PLD.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate to user-accessible and user-controllable freeze-logic in PLDs, and associated methods. More specifically, the disclosed concept provide for the use of user-accessible and user-controllable freeze-logic for the adjustment or reduction of dynamic power consumption of PLDs.

Figure 1:
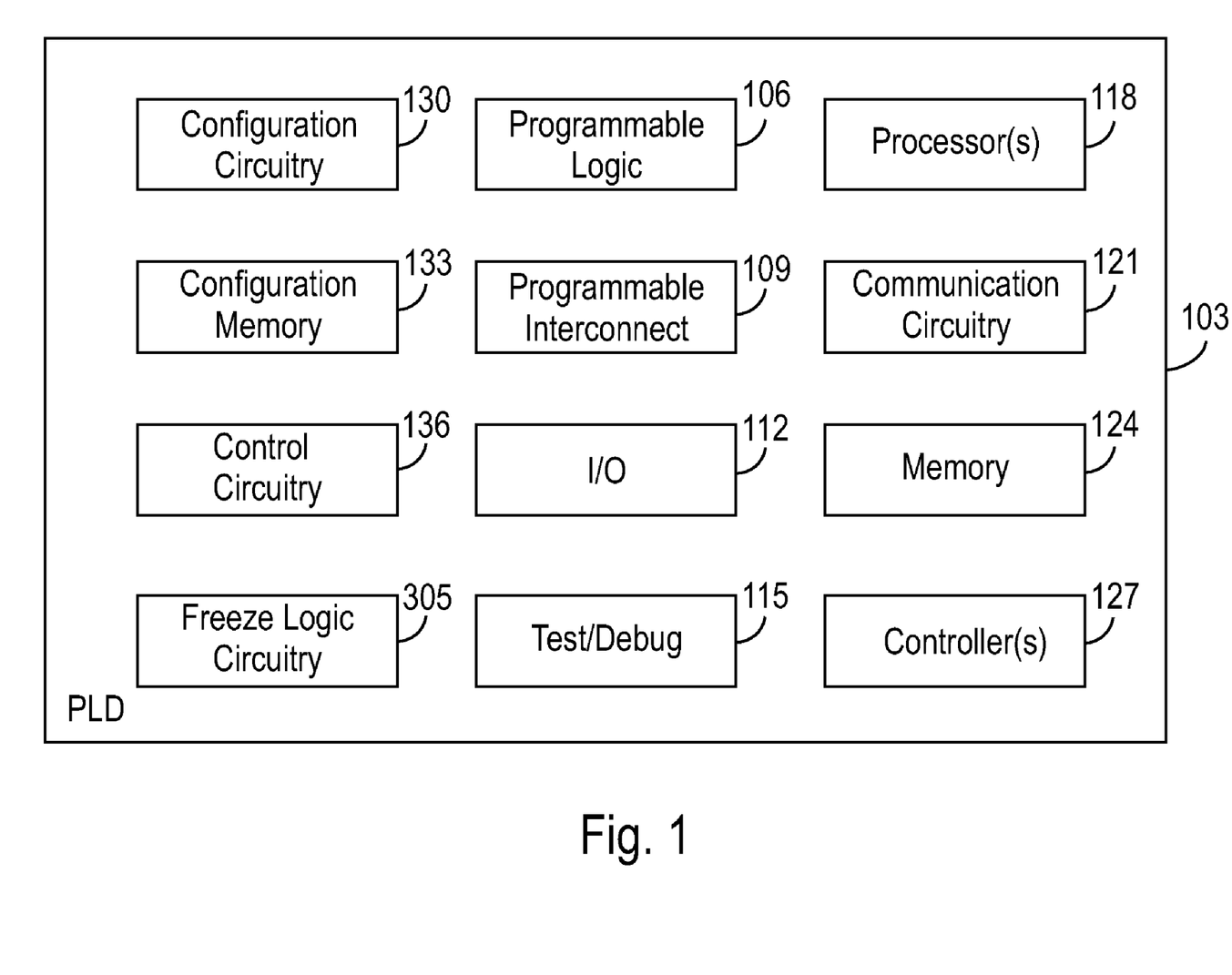
FIG. 1 illustrates a general block diagram of a PLD according to exemplary embodiments.

FIG. 1 shows a general block diagram of a PLD 103 according to an illustrative embodiments. PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, as desired. PLD 103 includes freeze-logic circuitry 305, as described below in detail.

Figure 2:
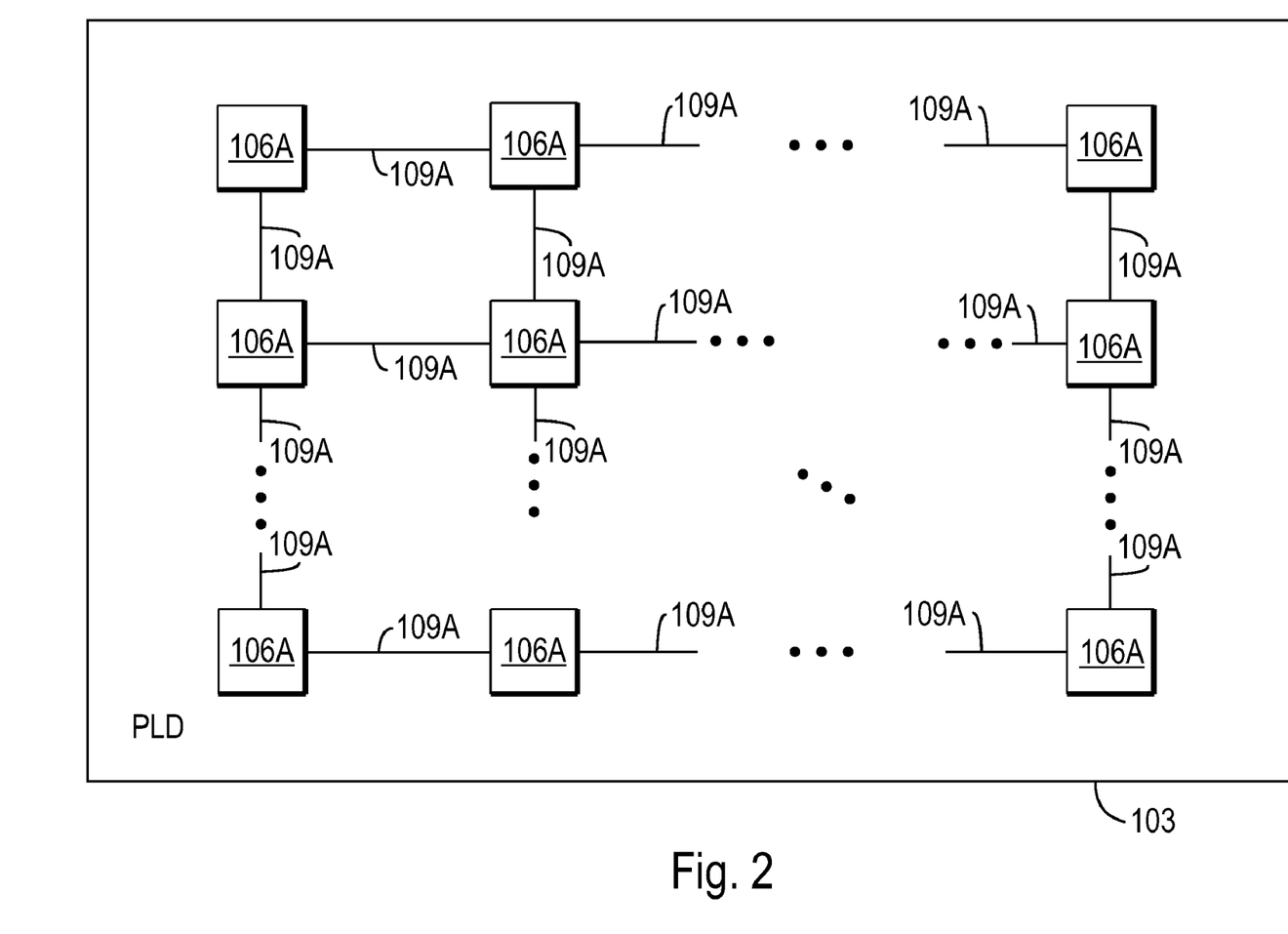
FIG. 2 shows a conceptual, simplified block diagram of programmable logic and programmable interconnect in a PLD according to an exemplary embodiment.

Note that FIG. 2 shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-signal circuitry, as desired. One may the design methodology and disclosed concepts to various resources, blocks, or circuits of PLD 103, as desired. Furthermore, one may apply the disclosed methodology and concepts to other PLD architectures, including any desired blocks, regions, or circuits, as persons of ordinary skill in the art who have the benefit of the description of the invention understand.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103, including aspects of the inventive concepts. Under the supervision of control circuitry 136, PLD configuration circuitry 130 uses configuration data (which it obtains from an external source, such as a storage device, a host, etc.) to program or configure the functionality of PLD 103. Configuration data typically store information in CRAM 133. The contents of CRAM 133 determine the functionality of various blocks of PLD 103, such as programmable logic 106 and programmable interconnect 109, as persons of ordinary skill in the art who have the benefit of this disclosure understand.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired. PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of this disclosure understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

FIG. 2 shows a conceptual, simplified block diagram of programmable logic 106A and programmable interconnect 109A in a PLD according to an exemplary embodiment. PLD 103 includes programmable logic 106A arranged as a two-dimensional array. Programmable interconnect 109A, arranged as horizontal interconnect and vertical interconnect, couples the blocks of programmable logic 106A to one another.

In illustrative embodiments, PLDs may have a hierarchical architecture. In other words, each block of programmable logic 106 may in turn include smaller or more granular programmable logic blocks or circuits. In various PLDs such hierarchies are termed CLBs and slices (in the example of Xilinx Corporation devices), LABs or MegaLABs (in Altera Corporation devices), or generally "clusters" in the academic literature or other FPGA and PLD vendors, but all fall within the scope of the concepts disclosed here. Such hierarchies often, but not always, share routing interfaces and control signals such as clock and reset lines. For example, in one embodiment, programmable logic 106 may constitute blocks of configurable logic named logic array block (LAB), and each LAB may include logic elements (LEs), slices, half-slices, or other circuitry, as desired. Persons of ordinary skill in the art who have the benefit of this disclosure understand, however, that a wide variety of other arrangements, with varying terminology and topology, are possible, and fall within the scope of the concepts disclosed here.

One may apply desired power management techniques (e.g., dynamic power consumption adjustment or reduction) at a desired or suitable level of granularity. For example, one may apply the techniques at a chip quadrant, octant, row, or other region of the chip with a per-LAB, per multi-LAB, or per-LE granularity level, as desired, and as described below in detail.

Figure 3:
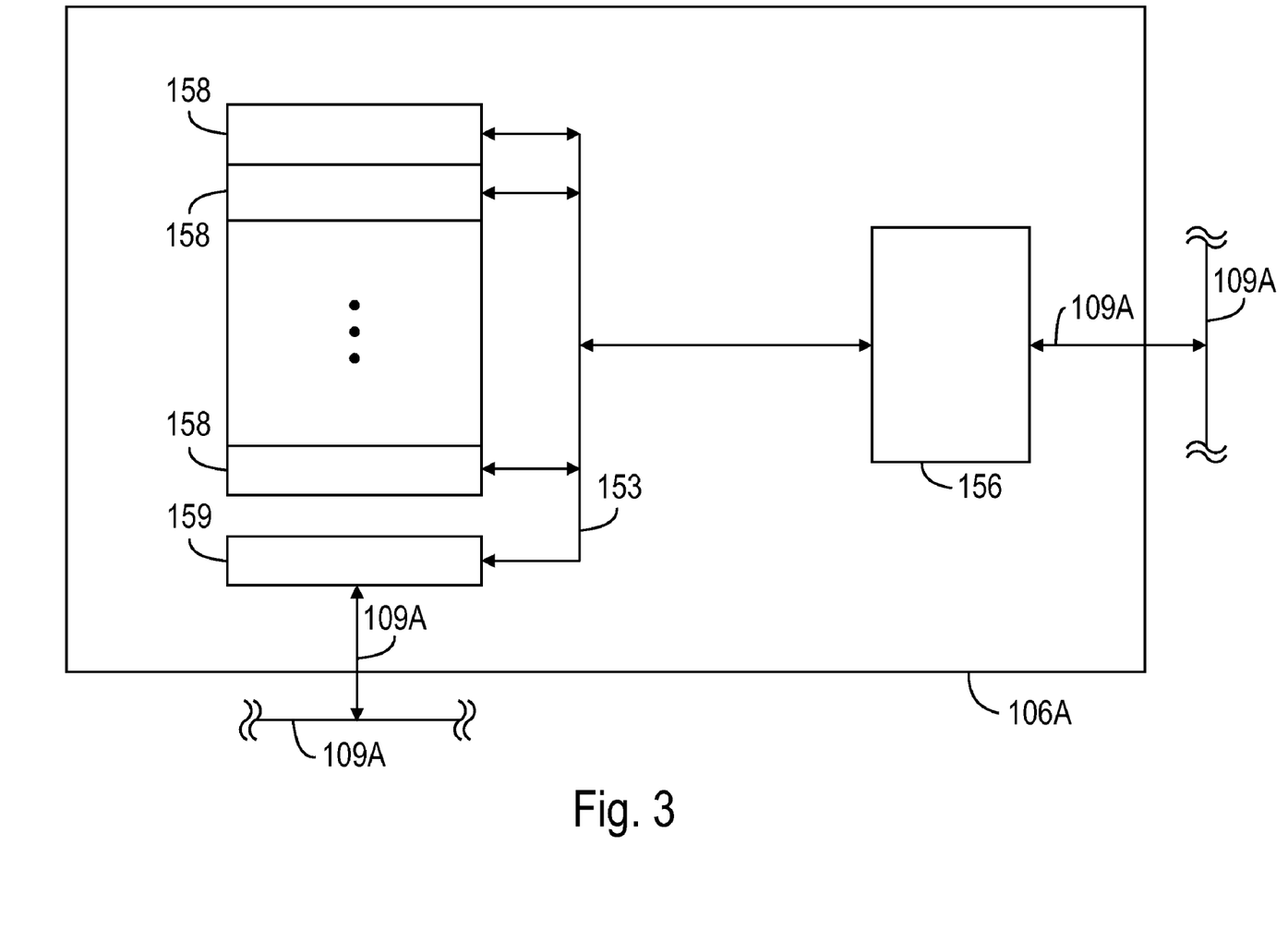
FIG. 3 depicts a conceptual block diagram of hierarchical programmable logic in a PLD according to an exemplary embodiment.

As noted above, PLDs according to exemplary embodiments have a hierarchical architecture. A resource block (e.g., LAB) 106A may, for instance, include smaller blocks of programmable logic circuitry, as FIG. 3 illustrates. More specifically, programmable logic 106A includes logic elements (LEs) or programmable logic circuits or blocks 158, local interconnect 253, interface circuit 156, and interface circuit 159.

Logic elements 158 provide configurable or programmable logic functions, for example, LUTs, registers, product-term logic, etc., as persons of ordinary skill in the art who have the benefit of this disclosure understand. Local interconnect 153 provides a configurable or programmable mechanism for logic elements 158 to couple to one another or to programmable interconnect 109 (sometimes called "global interconnect"), as desired.

Interface circuit 156 and interface circuit 159 provide a configurable or programmable way for programmable logic 106A block of circuitry to couple to programmable interconnect 109 (and hence to other programmable logic 106, as FIG. 2 shows). Interface circuit 156 and interface circuit 159 may include MUXs, registers, buffers, drivers, and the like, as persons of ordinary skill in the art who have the benefit of this disclosure understand.

Traditionally, PLDs use a freeze logic signal during configuration of the PLD (i.e., programming or configuring the PLD to implement the user's desired functionality). Configuration of the PLD proceeds in a serial fashion, where configuration bits provided by configuration circuitry 130 determine the functionality of the various resources of PLD 103.

Figure 4:
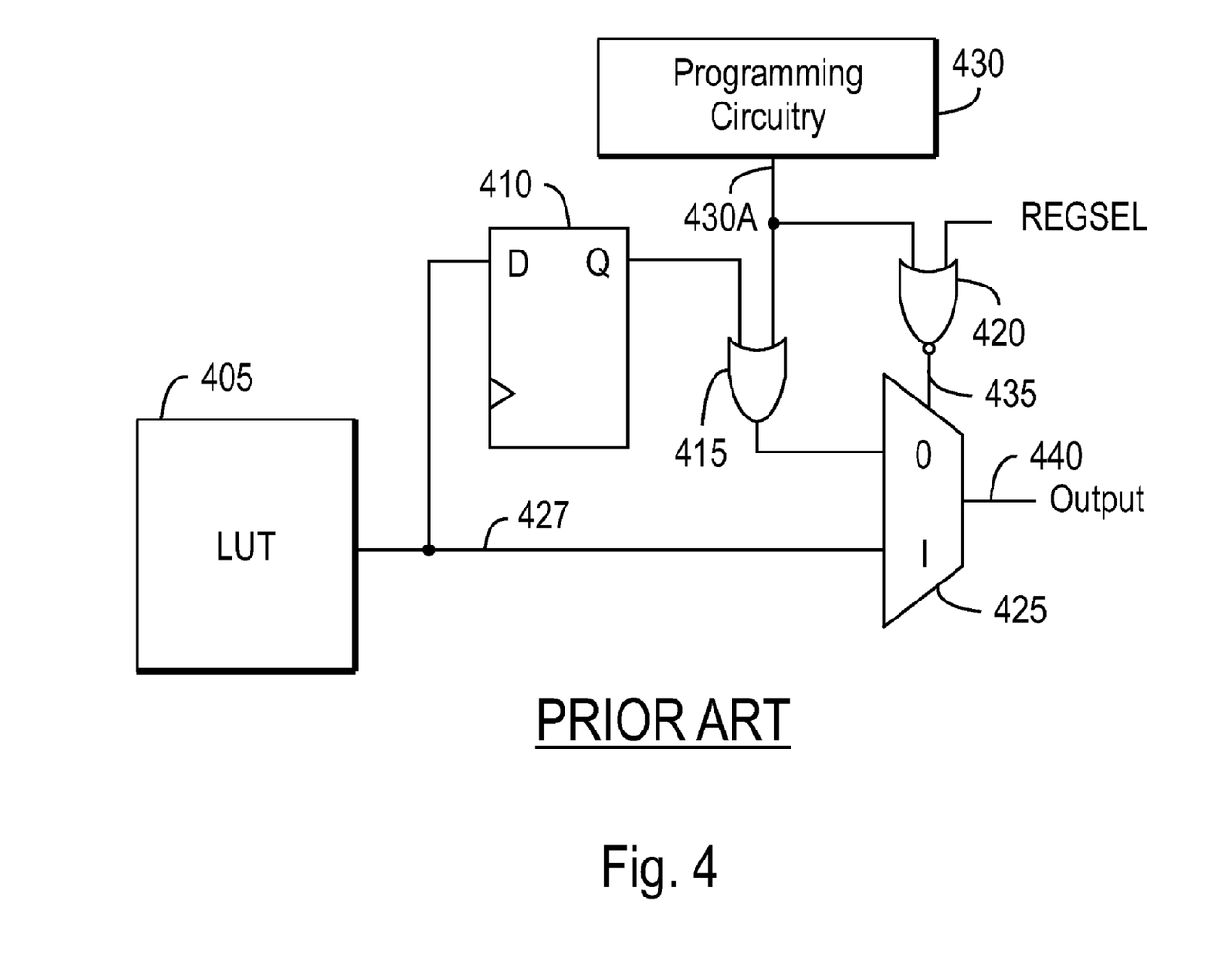
FIG. 4 shows operation of the freeze logic signal in a conventional PLD.

To avoid contention in the signal values of various nodes, PLDs conventionally use a freeze logic signal. FIG. 4 shows the use of the freeze logic signal in a conventional PLD. During the power-up and programming sequence, programming bits arrive in serial fashion, or alternatively by iteratively writing a frame or word of data after first shifting it into a programming register. During the programming of the PLD, the programming bits shift through the PLD's various circuits. At the conclusion of the programming, the programming bits reside in the proper place, so as to implement the user's desired functionality in the PLD.

During this sequence of events, more than one signal might attempt to drive a given node. Driving a node by multiple signals might consequently result in contention. To avoid that situation, PLDs use freeze signals that force certain nodes to a specific value, for example, the supply voltage, $V_{DD}$, or the ground voltage, $V_{SS}$, etc. The use of the freeze signals also forces the internal MUX signals to $V_{DD}$.

After configuration ends (i.e., the programming mode ends), the programming circuitry de-asserts the freeze signal. The PLD then enters the user mode. In this mode, the PLD can function as programmed by the programming bits. In other words, the PLD implements the user's desired functionality and circuitry by using the programmable resources of the PLD.

More specifically, referring to FIG. 4, during the programming mode, programming circuitry 430 asserts freeze signal 430A, by driving high an input of OR gate 415. As a result, the output of OR gate 415 assumes a logic one level, which it supplies to the input of multiplexer (MUX) 425, labeled "0." Concurrently, freeze signal 430A drives high an input of NOR gate 420, which causes output signal 435 of NOR gate 420 to assume a logic zero level. Output signal 435 drives the select input of MUX 425. As a consequence of the logic zero level of signal 435, MUX 425 provides to its output 440 the signal present at the input labeled "0," i.e., the logic one output of OR gate 415. Accordingly, output 440 will have a logic one value.

Note that in this mode, the assertion of freeze signal 430A causes a logic one level at output 440 regardless of the output signal 427 of look-up table (LUT) circuitry 405. Furthermore, note that the output of flip-flop 410 does not affect output 440 as long as programming circuitry 430 asserts freeze signal 430A. Thus, asserting freeze signal 430A drives to logic one output signal 440, and helps to prevent contention at any node(s) to which output signal 440 couples.

At the conclusion of the programming mode, programming circuitry 430 de-asserts freeze signal 430A. As a result, the output of OR gate 415 depends on the output of flip-flop 410 (and, hence, on the output value of LUT 405). Furthermore, note that signal REGSEL (register select) may now drive select signal 435, and determine whether MUX 425 provides as output signal 440 the registered or unregistered output of LUT 405 (i.e., the output of LUT 405 directly, or as registered via flip-flop 410).

In conventional PLDs, such as shown in FIG. 4, programming circuit 430 determines the state or logic value of freeze signal 430A. The user does not affect or control the logic value of freeze signal 430A, and does not have access to freeze signal 430A. In other words, when the PLD enters the user mode, freeze signal 430A does not affect the operation of the PLD, and the user neither access to freeze signal 430 nor may control it.

In the novel PLDs disclosed here, however, the user not only has access to the freeze signal, but may control its state and logic level during the user mode. Furthermore, the user may assert a freeze signal with a desired level of granularity, for example, to the entire PLD, to selected parts and circuits within the PLD, or even to a single circuit, logic block or LAB or LE or groups of LEs, etc., as desired. By doing so, the user may in effect disable the affected portion of the PLD and cause its dynamic power consumption or dissipation to decrease. As one aspect of the disclosed concepts, one may synthesize signals to gate power consumption of a desired signal by disabling the circuit or preventing toggling of one or more signals or nodes.

Figure 5A:
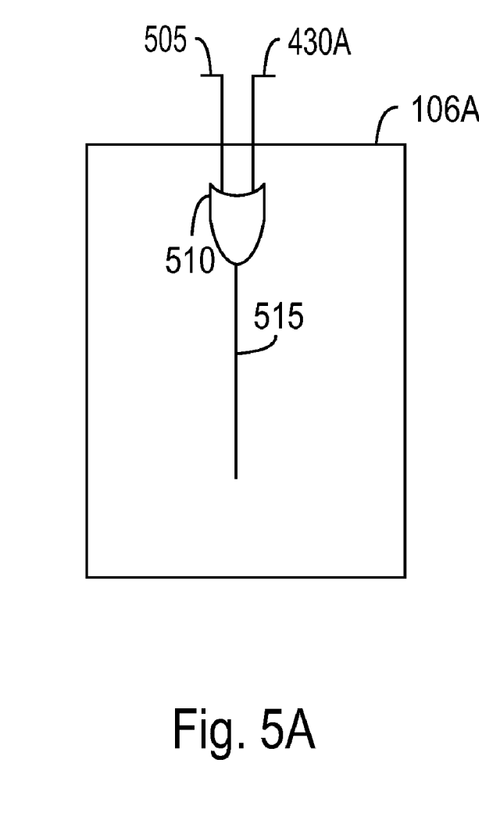
FIGS. 5A and 5B illustrate exemplary embodiments of circuitry within a PLD according to the disclosed concepts.
Figure 5B:
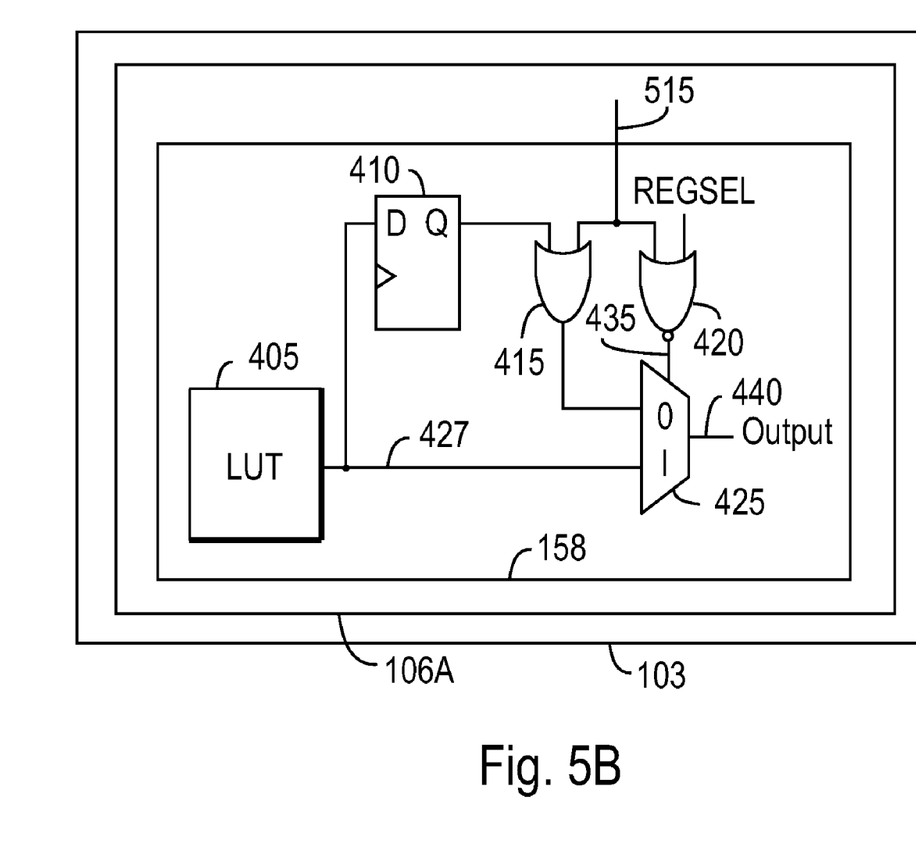

FIGS. 5A and 5B show exemplary embodiments of circuitry within a PLD according to the disclosed concepts. Specifically, FIG. 5A shows use of a user-accessible and/or user-controllable freeze signal in a resource block or LAB. OR gate 510 performs a logical OR operation on freeze signal 430A and user-accessible freeze signal 505 to produce LAB freeze signal 515. The use may access and/or control (program) freeze signal 505 during the user mode of PLD 103.

FIG. 5B shows the use of LAB freeze signal 515 in LAB 106A of PLD 103. LAB 106A may include one or more logic elements or LEs, although for the sake of simplifying the presentation, FIG. 5B illustrates one LE 158. LAB freeze signal 515 may couple to one or more LEs 158 in LAB 106A, as desired. LE 158 has a similar structure to the circuit in FIG. 4, but it uses LAB freeze signal 515. By accessing and controlling LAB freeze signal 515, the user may assert control over the operation of LE 158 (or LEs 158), and thus control the dynamic power consumption of LAB 106A and, hence, of PLD 103.

More specifically, during the programming mode, configuration circuitry 130 (see FIG. 1) asserts freeze signal 430A (see FIG. 5A), by driving high an input of OR gate 510. As a result, the output of OR gate 510, i.e., LAB freeze signal 515, assumes a logic one level. Consequently, OR gate 415 drives the input of multiplexer (MUX) 425, labeled "0," with a logic one value.

LAB freeze signal 515 drives high an input of NOR gate 420, which causes output signal 435 of NOR gate 420 to assume a logic zero level. Output signal 435 drives the select input of MUX 425. As a consequence of the logic zero level of signal 435, MUX 425 provides to its output 440 the signal present at the input labeled "0," i.e., the logic one output of OR gate 415. Accordingly, output 440 will have a logic one level.

Note that in this mode, the assertion of freeze signal 430A causes a logic one level at output 440 regardless of the output signal 427 of look-up table (LUT) circuitry 405, and regardless of the logical state of user-accessible freeze signal 505. Furthermore, note that the output of flip-flop 410 does not affect output 440 as long as configuration circuitry 130 asserts freeze signal 430A. Thus, asserting freeze signal 430A drives to logic one output signal 440, and helps to prevent contention at any node(s) to which output signal 440 couples, similar to a conventional PLD.

At the conclusion of the programming mode, configuration circuitry 130 de-asserts freeze signal 430A (i.e., freeze signal 430A has a logic zero value), and the user mode commences. Because of the logic zero value of freeze signal 430A, the logical value of the output of OR gate 510, i.e., LAB freeze signal 515, depends on the value of user-accessible freeze signal 505.

As noted, the user may access (the signal can be programmably routed either from a signal in the user's circuit or elsewhere as opposed to being statically programmed by a configuration bit) and/or control user-accessible freeze signal 505. Thus, the user may program user-accessible freeze signal 505 to have a logical zero or logical one value, as desired. By doing so, the user may control dynamic power consumption of LAB 106A, as described below in more detail.

If the user assigns a logical one value to user-accessible freeze signal 505, then LAB freeze signal 515 will have a logical one value. As a result, OR gate 415 will drive input "0" of MUX 425 with a logical one value. As a further result, output signal 435 of NOR gate 420 will have a logical zero value, thus causing MUX 425 to propagate the signal at its "0" input (i.e., logical one) to output 440. In other words, by assigning a logical one to user-accessible freeze signal 505, the user can cause output 440 to assume a logical one value, regardless of the values of the outputs of LUT 405, flip-flop 410, etc.

As a consequence, the user may limit or freeze toggling of signals in LAB 106A and other circuits whose operation and signal values depend on the value of output signal 440. Put another way, the user may control dynamically the power consumption in LAB 106A and possibly other circuitry within PLD 103 and, thus, overall reduce power consumption of PLD 103A.

On the other hand, if the user assigns a logical zero value to user-accessible freeze signal 505, then LAB freeze signal 515 will have a logical zero value. Consequently, the output signals of OR gate 415 and NOR gate 420 will depend on other signals in LAB 106A, such as the outputs of flip-flop 410 and LUT 405. In other words, the output of OR gate 415 depends on the output of flip-flop 410 (and, hence, on the output value of LUT 405). Furthermore, signal REGSEL (register select) may now drive select signal 435, and determine whether MUX 425 provides as output signal 440 the registered or unregistered output of LUT 405 (i.e., the output of LUT 405 directly, or as registered via flip-flop 410). Thus, in this scenario, LAB 106A may operate similarly to a conventional LAB.

Figure 6A:
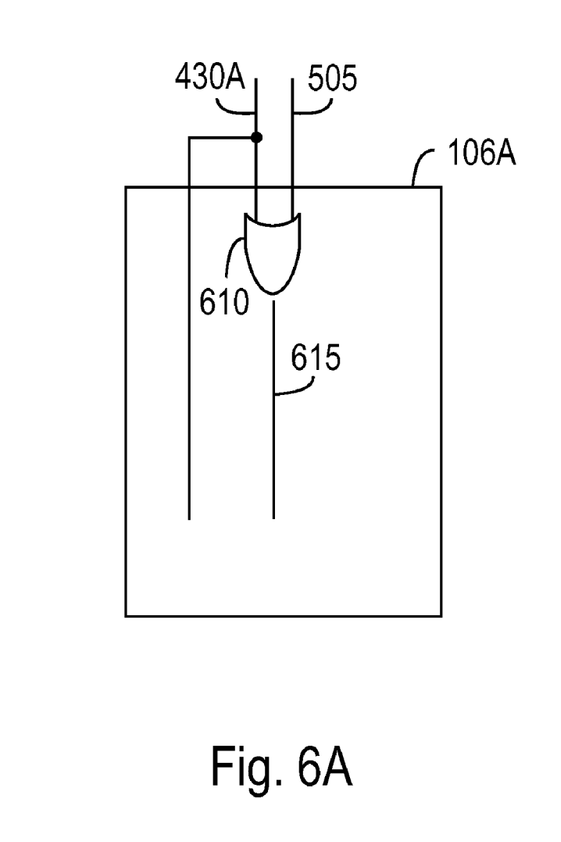
FIGS. 6A and 6B depict additional exemplary embodiments of circuitry within a PLD according to the disclosed concepts.
Figure 6B:
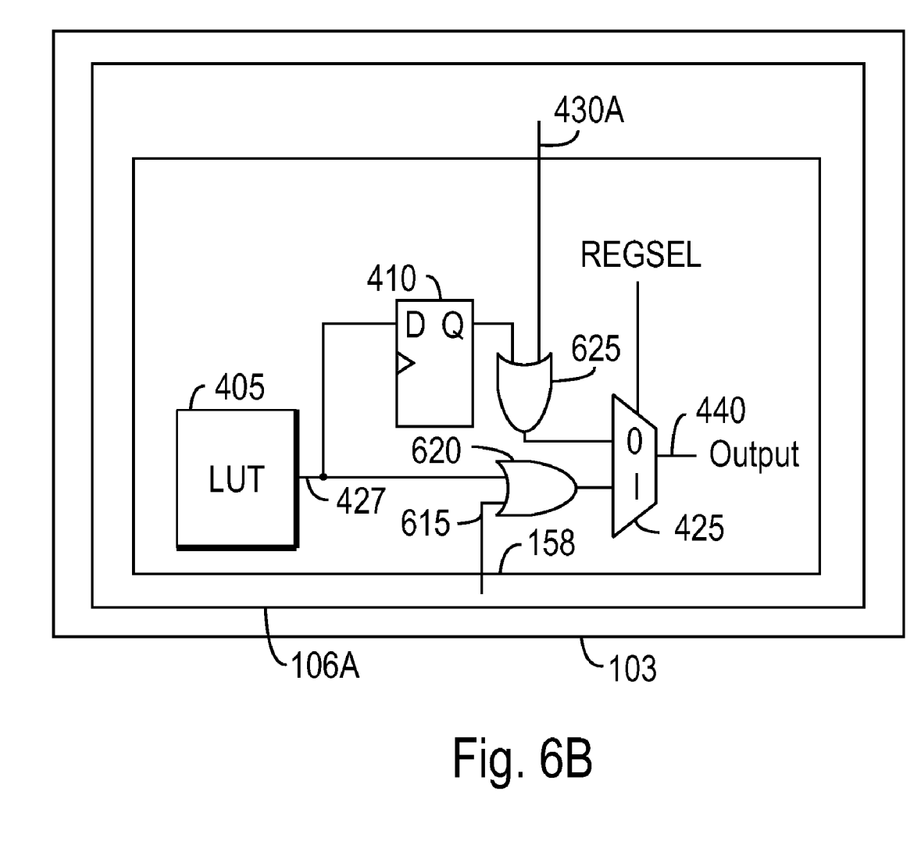

FIGS. 6A and 6B show additional exemplary embodiments of circuitry within a PLD according to the disclosed concepts. More specifically, FIGS. 6A and 6B depict circuitry for providing user-accessible/controllable freeze logic signals to control combinational signals within PLD resource blocks or LABs.

FIG. 6A shows use of a user-accessible and/or user-controllable freeze signal in a resource block or LAB. OR gate 610 functions similarly to OR gate 510 (see FIG. 5A), and performs a logical OR operation on freeze signal 430A and user-accessible freeze signal 505 to produce combinational freeze signal 615. As noted above, the use may access and/or control (program) freeze signal 505 during the user mode of PLD 103.

FIG. 6B shows the use of combinational freeze signal 615 in LAB 106A of PLD 103. LAB 106A may include similar circuitry as shown in FIG. 5B, but with the differences described below. combinational freeze signal 615 may couple to one or more LEs 158 in LAB 106A, as desired. By accessing and controlling combinational freeze signal 615, the user may assert control over the operation of LE 158 (or LEs 158), and thus control the dynamic power consumption of LAB 106A and, hence, of PLD 103.

More specifically, during the programming mode, configuration circuitry 130 (see FIG. 1) asserts freeze signal 430A (see FIG. 5A). As a result, the output of OR gate 610, i.e., combinational freeze signal 615, and thus the outputs of OR gate 625 and OR gate 620 assume a logic one level. Consequently, regardless of the select signal of MUX 425, i.e., signal REGSEL, MUX 425 drives output 440 to a logical one value. Similar to FIGS. 5A and 5B, asserting freeze signal 430A drives to logic one output signal 440, and helps to prevent contention at any node(s) to which output signal 440 couples, similar to a conventional PLD.

At the conclusion of the programming mode, configuration circuitry 130 de-asserts freeze signal 430A (i.e., freeze signal 430A has a logic zero value), and the user mode commences. Because of the logic zero value of freeze signal 430A, the logical value of the output of OR gate 610, i.e., combinational freeze signal 615, depends on the value of user-accessible freeze signal 505. By programming combinational freeze signal 615, the user may control dynamic power consumption of LAB 106A, as described below in more detail.

If the user assigns a logical one value to user-accessible freeze signal 505, then combinational freeze signal 615 will have a logical one value. As a result, OR gate 620 will drive input "1" of MUX 425 with a logical one value. Thus, regardless of the value of the output signal of LUT 405, input "1" of MUX 425 cannot toggle. In effect, asserting user-accessible freeze signal 505 freezes or prevents toggling of the input of MUX 425 that corresponds to the combinational LAB signal, i.e., the output of LUT 405.

As a consequence, the user may limit or freeze toggling of some signals in LAB 106A and other circuits whose operation and signal values depend on the value of output signal 440. Put another way, the user may control dynamically the power consumption in LAB 106A and possibly other circuitry within PLD 103 and, thus, overall reduce power consumption of PLD 103A. The registered input of MUX 425, i.e., input "0," however, may toggle according to the output of flip-flop 410 (note that freeze signal 430A has a logical zero value in this mode).

On the other hand, if the user assigns a logical zero value to user-accessible freeze signal 505, then combinational freeze signal 615 will have a logical zero value. Consequently, the output signal of OR gate 620 will depend on the output signal of LUT 405. Hence, under these circumstances, LAB 106A may operate similarly to a conventional LAB.

Figure 7:
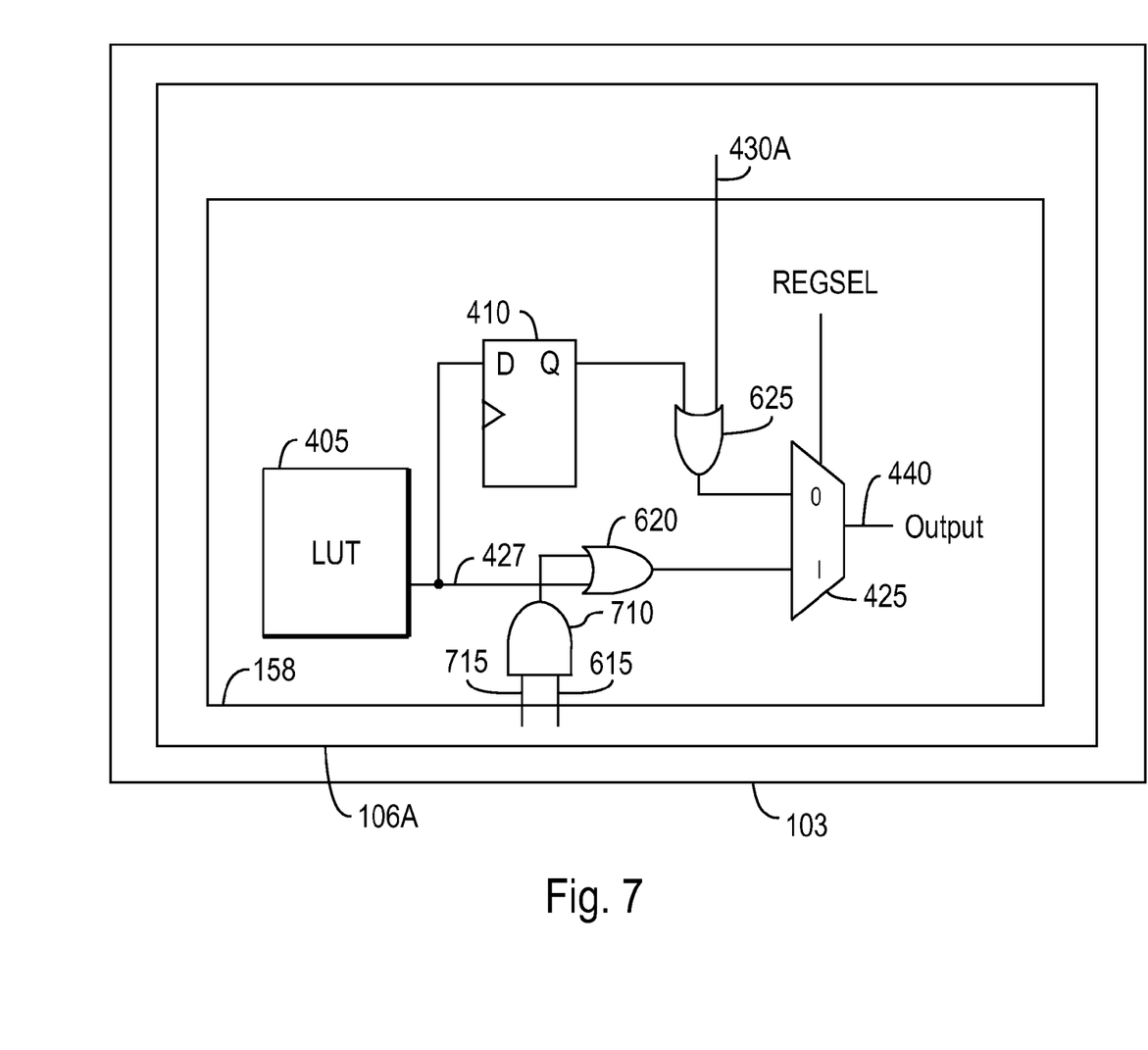
FIG. 7 shows another exemplary embodiment of circuitry within a PLD according to the disclosed concepts.

As FIGS. 5A and 6A suggest, LAB freeze signal 515 and combinational freeze signal 615 constitute LAB-wide signals in the sense that their effect applies to a desired set of LEs in a LAB equally. In some circumstances, the user may wish to apply a user-accessible/controllable freeze signal to some LEs in the LAB, but not others (even though the freeze signal routes to all or most LEs). FIG. 7 shows another exemplary embodiment of circuitry within a PLD according to the disclosed concepts that allows application of user-accessible/controllable freeze signals on a per-LE basis.

Specifically, the embodiment in FIG. 7 has a similar structure to the embodiment in FIG. 6B, and operates in a similar manner. Unlike the circuit of FIG. 6B, however, the embodiment in FIG. 7 includes AND gate 710. Combinational freeze signal 615 drives one input of AND gate 710. A configuration bit line 715 drives a second input of AND gate 710. (Configuration circuitry 130 (see FIG. 1) may supply configuration information or date via configuration bit line 715.)

By selective programming of configuration bit line 715, one may make combinational freeze signal 615 applicable on a per-LE basis. If configuration bit line 715 for a particular LE 158 has a logical one value, then it allows the propagation of combinational freeze signal 615 through AND gate 710. In this situation, the circuit essentially operates in the same manner as the embodiment in FIG. 6B.

If configuration bit line 715 for the particular LE 158 applies a logic zero value to AND gate 710, however, combinational freeze signal 615 cannot propagate to OR gate 620. In this scenario, the output of LUT 405 determines the output value of OR gate 620. By selectively programming configuration bit lines 715 for one or more LEs 158, one may control the dynamic power consumption of the one or more LEs 158 with a specific level of granularity, as desired.

Figure 8:
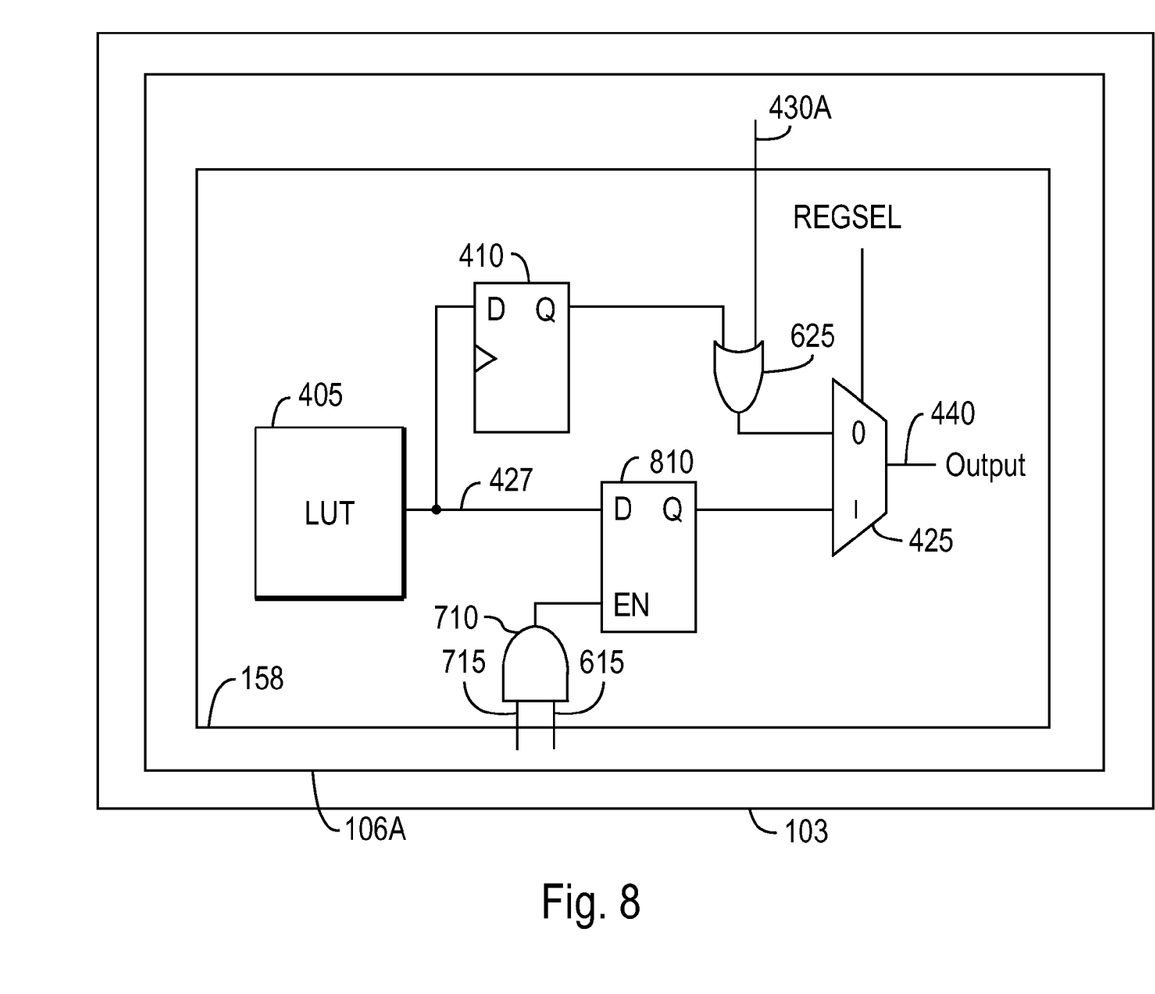
FIG. 8 illustrates yet another embodiment according to the disclosed concepts.

FIG. 8 shows yet another embodiment according to the disclosed concepts. The embodiment in FIG. 8 provides an additional refinement or functionality to the embodiment in FIG. 7. Specifically, in the addition to the circuitry in FIG. 7, the embodiment in FIG. 8 includes latch 810. Latch 810 receives at its D input the output of LUT 405, and provides its Q or latched output to input "1" of MUX 425.

The output of AND gate 710 drives the EN (enable) input of latch 810. Configuration bit line 715 and combinational freeze signal 615 drive the inputs of AND gate 710, as described above in detail.

If configuration bit line 715 for a particular LE 158 has a logical one value, then it allows the propagation of combinational freeze signal 615 through AND gate 710. In this situation, combinational freeze signal 615 may enable latch 810, depending on its logical value. If combinational freeze signal 615 has a logic one value, then latch 810 may provide to input "1" of MUX 425 the current value of the output of LUT 405. Conversely, if combinational freeze signal 615 has a logic zero value, latch 810 provides the latched output of LUT 405 to input "1" of MUX 425, thus effectively preventing input "1" of MUX 425 from toggling.

On the other hand, if configuration bit line 715 for the particular LE 158 applies a logic zero value to AND gate 710, combinational freeze signal 615 cannot propagate to OR gate 620, and AND gate 710 has a logic zero value. Thus, the EN (enable) input of latch 810 has a logic zero value. In effect, combinational freeze signal 615 does not control the dynamic power consumption of the affected LE or LEs 158.

Note that one may use latch 810 for more than freeze-logic control. In other words, one may use latch 810 to implement the user's specified circuit or functionality, as desired. In this manner, the circuit in FIG. 8 provides additional flexibility to the user to balance and trade off additional functionality with dynamic power consumption.

Figure 9:
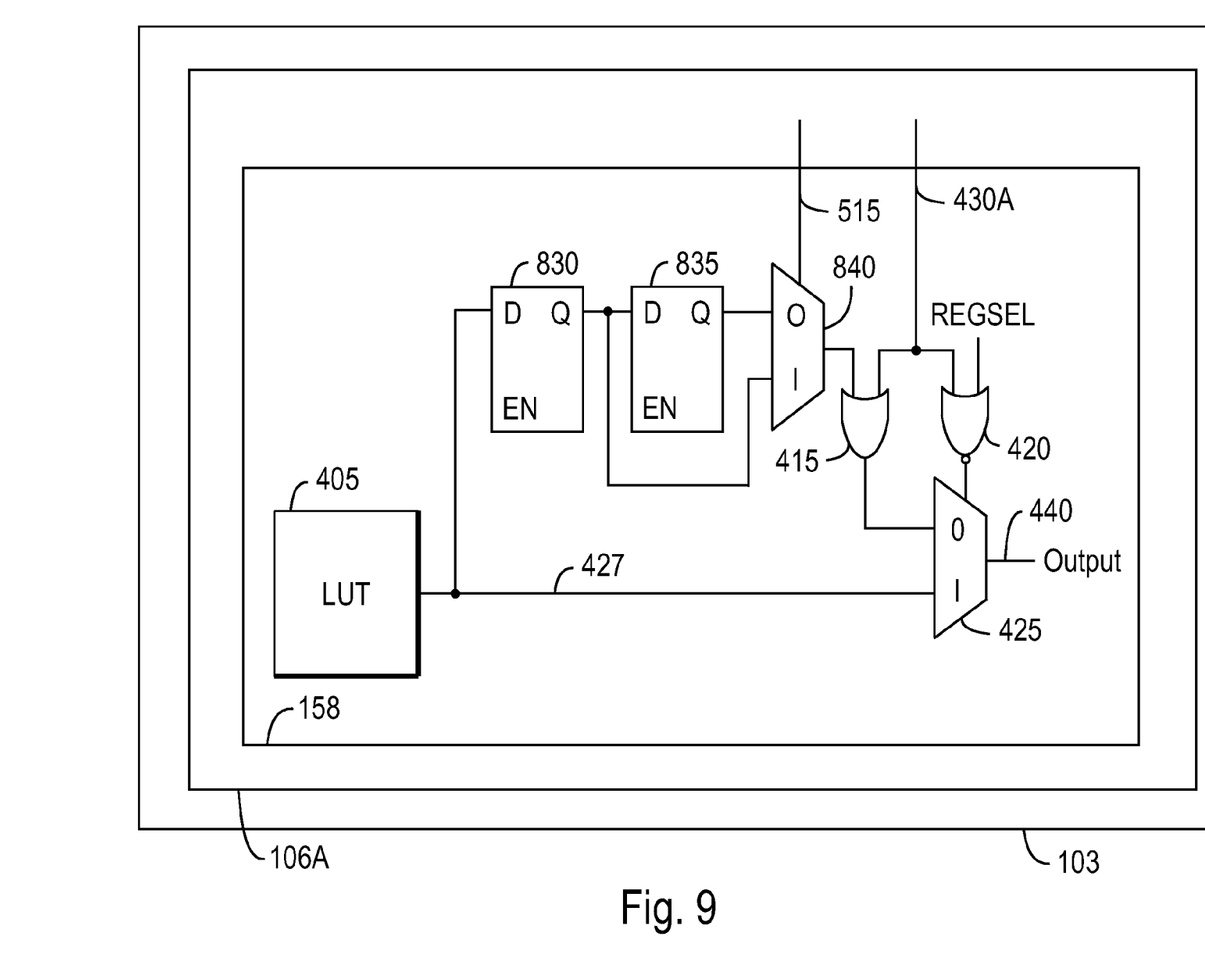
FIG. 9 depicts an additional exemplary embodiment of circuitry within a PLD according to the disclosed concepts.

FIG. 9 depicts an additional exemplary embodiment of circuitry within a PLD according to the disclosed concepts. This embodiment has a similar structure to, and operates in a similar manner, as the embodiment in FIG. 5B, with the following exceptions. First, note that freeze logic signal 430A, rather than LAB freeze signal 515, drives OR gate 415 and NOR gate 420. Second, note that latches 830 and 835, together with MUX 840, replace flip-flop 410 of FIG. 5B.

During the configuration mode, freeze signal 430A has a logic one value and, thus, forces a logic high at the output of OR gate 415, and at the output 440 of LE 158. During the user mode, however, freeze signal 430A has a logic zero value. In this mode, if LAB freeze signal 515 has a logic zero value, it causes input "0" of MUX 840 to propagate to OR gate 415. Thus, latch 830, latch 835, and MUX 840 operate much in the same way as flip-flop 410 in the embodiment of FIG. 5B.

If, on the other hand, LAB freeze signal 515 has a logic one value, it forces the signal at input "1" of MUX 840 to propagate to its output, thus to the output of OR gate 415, and to output 440 of MUX 425. Input "1" of MUX 840, however, constitutes the Q output of latch 830. In effect, a logic one value of LAB freeze signal 515 causes the propagation of the output of latch 830, rather than the output of latch 835, to output 440 of MUX 425.

Figure 10:
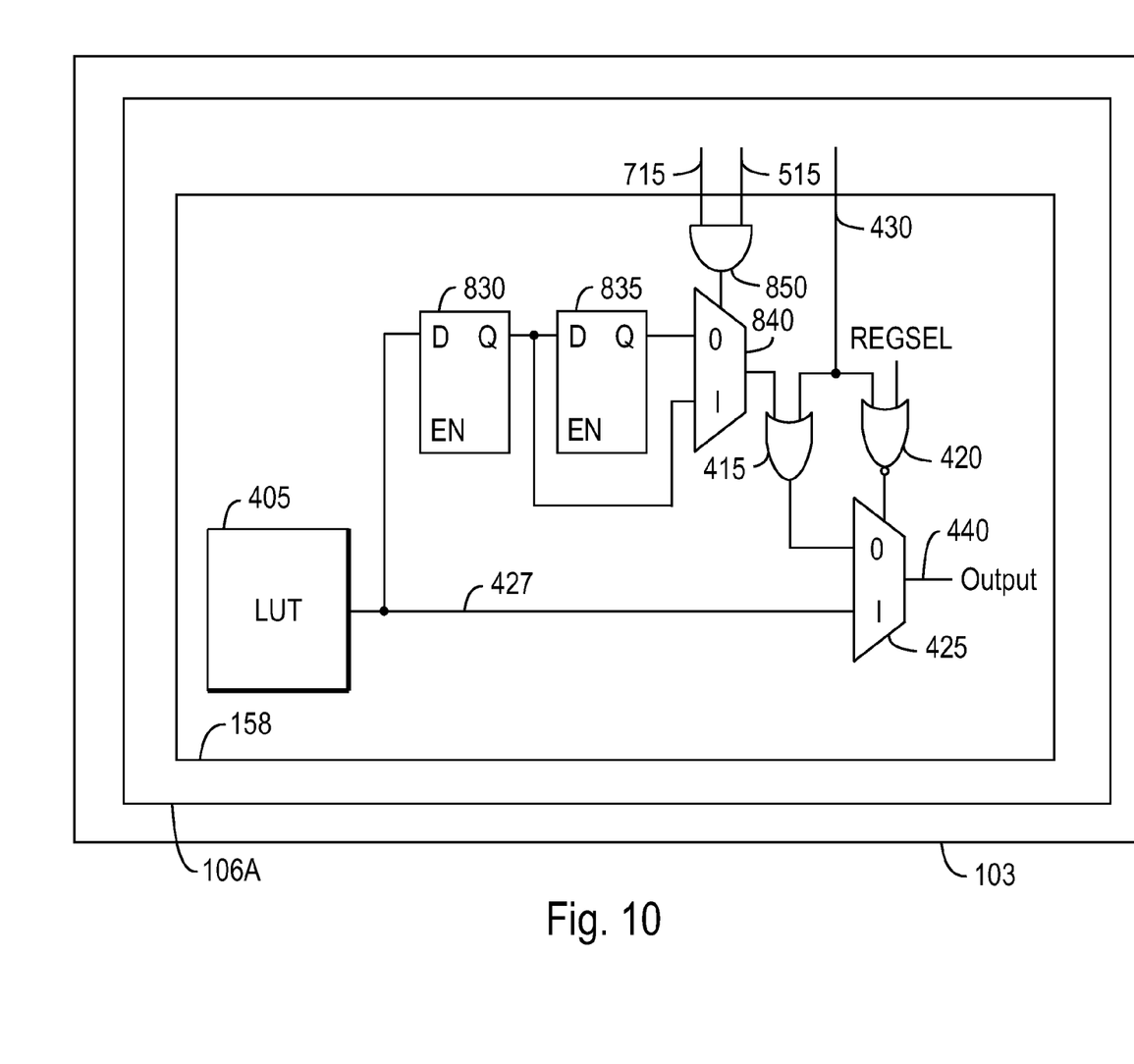
FIG. 10 shows another exemplary embodiment of circuitry within a PLD according to the disclosed concepts.

FIG. 10 shows another exemplary embodiment of circuitry within a PLD according to the disclosed concepts. The embodiment in FIG. 10 is similar to, and operates substantially similarly to, the embodiment in FIG. 9. In addition to the circuitry of the embodiment in FIG. 9, however, it includes AND gate 850. AND gate 850 allows the application of LAB freeze signal 515 selectively to one or more LEs 158 within LAB 106A.

More specifically, LAB freeze signal 515 drives one input of AND gate 850. A configuration bit line 715 drives a second input of AND gate 850. By selective programming of configuration bit line 715, one may make LAB freeze signal 515 applicable on a per-LE basis. If configuration bit line 715 for a particular LE 158 has a logical one value, then it allows the propagation of LAB freeze signal 515 through AND gate 850. In this situation, the circuit essentially operates in the same manner as the embodiment in FIG. 9.

If configuration bit line 715 for the particular LE 158 applies a logic zero value to AND gate 850, however, LAB freeze signal 515 cannot propagate to OR gate 620. In this scenario, LAB freeze signal 515 does not affect the operation of LE 158. By selectively programming configuration bit lines 715 for one or more LEs 158, one may control the dynamic power consumption of the one or more LEs 158 with a specific level of granularity, as desired.

A software system or algorithm allows access to the programming and use of the user-accessible/user-programmable freeze logic. In one embodiment of such a software system, a synthesis tool computes the required availability of signals in the netlist, and automatically synthesizes new logical signals to implement the freeze logic control. This task is accomplished, for example, by computing the observability don't-care conditions, or ODCs (as described, for example, in well known textbooks, such as "Synthesis and Optimization of Digital Circuits" by G. De Micheli, McGraw-Hill 1994) to determine candidates for freeze-logic control signals. When such signals are determined to control the output of a register (or D flip-flop or DFF), a new signal is synthesized from the ODCs as clock-enable logic, and when they are determined to control a combinational output that is not a register, the ODC calculation supplies the freeze-logic control signal.

In PLDs it is possible that overuse of user-accessible/user-controllable freeze logic could cause stress or congestion within the routing network of the PLD. In an alternative embodiment, the CAD algorithm computes the effective routing stress, and balances the power savings achievable by the use of freeze-logic control against both the additional power consumption of routing an additional signal and the congestion of using an additional signal in the design.

In the LAB-based embodiments, further stress may be applied to the clustering, placement and routing stages of the CAD tool due to the limited number of LAB-wide signals available in the device. In one embodiment, a CAD tool computes the potential additional clusters required from freeze-logic signals prior clustering, and removes said signals if the cost of additional clusters is undesirable. In a further embodiment, the computation of potential freeze-logic signals is performed after the clustering and placement algorithm, as a so-called "physical synthesis" operation.

In some embodiments of the current invention, D-flip-flops are exposed as two D-latches, such as illustrated in FIG. 8. In a further embodiment, a software tool may synthesize logic using these D-latches rather than either flip-flops or combinational cycles (latches built out of general PLD routing fabric). In this case, the enable signal on the D-latch can further be used to gate signal propagation and further reduce dynamic power consumption.

One may complement the embodiments described above and in the corresponding figures with software techniques for reducing power consumption of PLDs, as desired, and as noted. For example, one may combine some or all of the circuitry in one or more of the embodiments described in this patent document with the techniques described in U.S. patent application Ser. No. 11/192,157, titled "Apparatus and methods for optimizing the performance of programmable logic devices," filed on Jul. 28, 2005, and incorporated by reference here in its entirety. By combining the user-accessible freeze-logic circuitry with the PLD synthesis and programming techniques described in U.S. patent application Ser. No. 11/192,157, one may arrive at a flexible system of controlling or reducing the power consumption of PLDs.

One may apply the disclosed concepts effectively to various ICs that include programmable or configurable logic circuitry, which may be known by other names in the art, as desired, and as persons skilled in the art with the benefit of this disclosure understand. Examples of such circuitry include devices known as complex programmable logic device (CPLD), programmable gate array (PGA), and field programmable gate array (FPGA).

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as the presently preferred or illustrative embodiments. Persons skilled in the art may make various changes in the shape, size and arrangement of parts without departing from the scope of the disclosure described in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. A programmable logic device (PLD), comprising:
a logic array block, comprising:
a first logic element that provides a first signal that a user of the programmable logic device (PLD) may freeze during a user mode of the programmable logic device (PLD).

2. The programmable logic device (PLD) according to claim 1, further comprising a second logic element that provides a second signal, wherein the user of the programmable logic device (PLD) may freeze the first signal without freezing the second signal.

3. The programmable logic device (PLD) according to claim 2, wherein freezing the first signal also freezes the second signal.

4. The programmable logic device (PLD) according to claim 1, wherein the first signal is frozen by using a logic array block freeze signal.

5. The programmable logic device (PLD) according to claim 1, wherein the first signal is frozen by using a user-accessible freeze signal.

6. The programmable logic device (PLD) according to claim 5, wherein the first signal is frozen by using a user-controllable freeze signal.

* * * * *